US008063462B2

(12) United States Patent
Tanida et al.

(10) Patent No.: US 8,063,462 B2
(45) Date of Patent: Nov. 22, 2011

(54) SEMICONDUCTOR DEVICE AND METHOD OF MANUFACTURING THE SAME

(75) Inventors: Kazumasa Tanida, Kawasaki (JP); Masahiro Sekiguchi, Yokohama (JP); Susumu Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 12/212,754

(22) Filed: Sep. 18, 2008

(65) Prior Publication Data
US 2009/0079020 A1     Mar. 26, 2009

(30) Foreign Application Priority Data
Sep. 20, 2007   (JP) .................. P2007-243663

(51) Int. Cl.
*H01L 31/02*     (2006.01)
(52) U.S. Cl. ......... 257/434; 257/E31.122; 257/E21.499; 438/56
(58) Field of Classification Search ............ 257/690, 257/682, 728, 433–434, E31.121–E31.124, 257/E21.499, E21.5; 438/56, 69, 73
See application file for complete search history.

(56) References Cited

U.S. PATENT DOCUMENTS

| | | | |
|---|---|---|---|
| 5,115,295 A * | 5/1992 | Hisa ........................ | 257/188 |
| 6,599,770 B2 * | 7/2003 | Miyamoto .................. | 438/48 |
| 7,042,623 B1 * | 5/2006 | Huibers et al. ............. | 359/291 |
| 7,180,149 B2 * | 2/2007 | Yamamoto et al. .......... | 257/434 |
| 7,271,460 B2 * | 9/2007 | Nagasaka et al. ............ | 257/432 |
| 7,696,593 B2 * | 4/2010 | Yoneda et al. .............. | 257/458 |
| 7,728,398 B2 * | 6/2010 | Nakajo et al. .............. | 257/432 |
| 7,852,392 B2 * | 12/2010 | Mochizuki .................. | 348/307 |
| 2002/0019069 A1 * | 2/2002 | Wada ........................ | 438/69 |
| 2003/0160185 A1 * | 8/2003 | Homme ..................... | 250/483.1 |
| 2006/0076636 A1 * | 4/2006 | Fukunaga ................... | 257/432 |
| 2006/0138480 A1 * | 6/2006 | Adkisson et al. ........... | 257/291 |
| 2007/0126912 A1 * | 6/2007 | De Bruin et al. ........... | 348/340 |
| 2007/0235882 A1 | 10/2007 | Sekiguchi et al. | |
| 2007/0285784 A1 * | 12/2007 | Yamada et al. ............. | 359/582 |
| 2008/0073740 A1 * | 3/2008 | Shibayama ................. | 257/434 |
| 2009/0140363 A1 * | 6/2009 | Prima et al. ............... | 257/433 |
| 2009/0189233 A1 * | 7/2009 | Liu et al. ................... | 257/432 |

FOREIGN PATENT DOCUMENTS

| | | |
|---|---|---|
| EP | 1662564 | 8/2004 |
| JP | 08-088339 | 4/1996 |
| WO | 2005/022631 | 3/2005 |

* cited by examiner

*Primary Examiner* — Matthew W Such
*Assistant Examiner* — Ali Naraghi
(74) *Attorney, Agent, or Firm* — Turocy & Watson, LLP

(57) ABSTRACT

A semiconductor device includes a semiconductor substrate having a first surface in which a light-receiving portion and electrodes are provided. The semiconductor substrate has a penetrating wiring layer connecting the first surface and the second surface. A light-transmissive protective member is disposed on the semiconductor substrate so as to cover the first surface. A gap is provided between the semiconductor substrate and the light-transmissive protective member. A protective film is formed at a surface of the light-transmissive protective member. The protective film has an opening provided at a region corresponding to the light-receiving portion.

17 Claims, 5 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-243663, filed on Sep. 20, 2007; the entire contents of which are incorporated herein by reference.

BACKGROUND OF THE INVENTION

1. Field of the Invention

The present invention relates to a semiconductor device and a manufacturing method of the same.

2. Description of the Related Art

Semiconductor devices such as a CCD, CMOS image sensor using semiconductor integrated circuit technology are widely used for a digital camera and a cellular phone with camera function. In the semiconductor device as stated above, it is proposed that sensor chips (semiconductor elements) are made to be a CSP (Chip Size Package) to correspond to small in size and light in weight of mounted parts. It is studied that a penetrating wiring layer (a penetrating electrode) connecting between front and rear both surfaces is applied for a semiconductor substrate on which a sensor device and so on are formed when the semiconductor element such as the sensor chip is made to be the CSP.

The penetrating wiring layers are formed by providing through holes joining between front and rear both surfaces at the semiconductor substrate, and filling conductor layers inside this through holes. An integrated circuit including a light-receiving portion provided at the front surface of the semiconductor substrate and external connection terminals provided at the rear surface are electrically connected via the penetrating wiring layers. The integrated circuits, the penetrating wiring layers, and so on are formed during a wafer process. A case with optical lens is attached to the semiconductor device in which a semiconductor wafer is cut to be a separated piece (an image sensor and so on). This is mounted on a module substrate in a state as stated above, and thereby, a camera module is constituted.

A light-transmissive protective member is disposed on the semiconductor substrate so as to cover a region including the light-receiving portion, to protect the light-receiving portion provided at the front surface of the semiconductor substrate from dust and garbage (refer to International Publication No. WO 2005/022631 A1). The light-transmissive protective members such as glass substrates are disposed in parallel with predetermined intervals on the semiconductor substrate where the integrated circuits including the light-receiving portions are formed. The glass substrates are adhered to the semiconductor substrate by an adhesive resin disposed so as to surround an outer edge of the light-receiving portions of the semiconductor substrate. The adhesive resin finally becomes to be a sealing member, and a gap sandwiched by the semiconductor substrate and the glass substrate is formed above the light-receiving portion.

The semiconductor device is manufactured as stated below. At first, the semiconductor substrate on which the integrated circuit including the light-receiving portion is formed and the glass substrate is adhered via the adhesive resin. Next, the through holes are formed by etching the semiconductor substrate from the rear surface side thereof until electrodes at the front surface side expose, after the semiconductor substrate is made thin from the rear surface side to be a predetermined thickness. Further, the penetrating wiring layers are formed from inside the through holes toward the rear surface of the semiconductor substrate after insulating films are formed on internal surfaces of the through holes and the rear surface of the semiconductor substrate except bottom portions of the through holes being closed by the electrodes. After that, the rear surface of the semiconductor substrate is covered with a protective layer, and the external connection terminals are formed at the penetrating wiring layers. The glass substrate plays a role as a supporting substrate mechanically reinforcing the semiconductor substrate during these manufacturing processes.

However, there is a problem that scratches and cracks are easy to occur on the glass substrate because the front surface of the glass substrate is directly touched when the semiconductor device is carried or placed on a stage of a processing equipment, in the conventional semiconductor device manufactured by the method as stated above. The scratches and cracks occurred on the glass substrate scatter incident light, and become a factor deteriorating sensitivity of the light-receiving portion and manufacturing yield of the semiconductor device. The light incident from a diagonal direction is refracted by the adhesive resin, and incident on the light-receiving portion, and thereby, image pickup characteristics and so on at a peripheral edge portion of image deteriorates, when the adhesive resin has light-transmission property.

SUMMARY OF THE INVENTION

A semiconductor device according to an aspect of the present invention includes: a semiconductor substrate having a first surface and a second surface at an opposite side of the first surface; a light-receiving portion provided on the first surface of the semiconductor substrate; an electrode, provided on the first surface of the semiconductor substrate, electrically connecting to the light-receiving portion; a penetrating wiring layer, provided at the semiconductor substrate to join the first surface and the second surface, electrically connecting to the electrode; a light-transmissive protective member disposed above the light-receiving portion via a gap, to cover the first surface of the semiconductor substrate; and a protective film, provided at a first surface of the light-tranmissive protective member at an opposite side of a second surface of the light-tranmissive protective member facing the first surface of the semiconductor substrate, having an opening corresponding to the light-receiving portion.

A manufacturing method of a semiconductor device according to an aspect of the present invention includes: preparing a semiconductor substrate having a first surface including a light-receiving portion and an electrode electrically connected to the light-receiving portion, and a second surface at an opposite side of the first surface; preparing a light-transmissive protective member having a first surface including a protective film having an opening corresponding to the light-receiving portion, and a second surface at an opposite side of the first surface; adhering the first surface of the semiconductor substrate and the second surface of the light-transmissive protective member while forming a gap above the light-receiving portion; forming a through hole at the semiconductor substrate from the second surface toward the first surface of the semiconductor substrate to expose the electrode; and forming a penetrating wiring layer connected to the electrode exposing inside the through hole, from inside the through hole toward the second surface of the semiconductor substrate.

DESCRIPTION OF THE EMBODIMENTS

Hereinafter, embodiments of the present invention are described with reference to the drawings.

Figure 1:
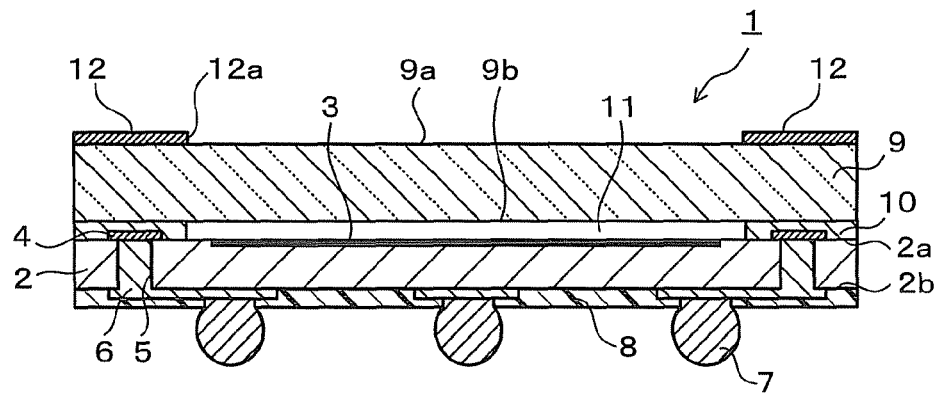
FIG. 1 is a sectional view showing a semiconductor device according to a first embodiment.

FIG. 1 shows a semiconductor device according to a first embodiment of the present invention. A semiconductor device 1 shown in FIG. 1 includes a semiconductor substrate 2. For example, a silicon (Si) substrate is used for the semiconductor substrate 2. The semiconductor substrate 2 has a first surface 2a and a second surface 2b at an opposite side thereof. The first surface (a front surface of the semiconductor substrate 2) 2a is a forming surface of semiconductor elements such as a photo diode and a transistor, and an active element region including wirings connecting the semiconductor elements and electrodes, and the second surface (a rear surface of the semiconductor substrate 2) 2b is a forming surface of external connection terminals.

The active element region including a light-receiving portion 3 is provided at the first surface 2a of the semiconductor substrate 2. The light-receiving portion 3 has a light-receiving element such as a photo diode, and energy lines such as light and electrons irradiated on the first surface 2a are light-received and collected to the photo diode. The light-receiving portion 3 and the other elements in the active element region, and plural electrodes 4 electrically connected to the wirings and so on to perform an input/output of electrical signals and a supply of electric power, are provided at the first surface 2a of the semiconductor substrate 2. The semiconductor substrate 2 having the active element region including the light-receiving portion 3 and the electrodes 4 constitutes an image sensor such as a CMOS image sensor.

The semiconductor substrate 2 has through holes 5 joining the first surface 2a and the second surface 2b. Openings at the first surface 2a of the through holes 5 are closed by the electrodes 4. The electrodes 4 expose inside the through holes 5. Conductive materials to be penetrating wiring layers 6 are filled in the through holes 5 via insulating layers (not-shown). The penetrating wiring layers 6 are electrically connected to the electrodes 4. The penetrating wiring layers 6 are provided from inside the through holes 5 toward the second surface 2b.

The penetrating wiring layers 6 are formed on the second surface 2b of the semiconductor substrate 2 via the insulating layers (not-shown). The penetrating wiring layers 6 are to connect the first surface 2a and the second surface 2b of the semiconductor substrate 2. Further, external connection terminals 7 electrically connected to the penetrating wiring layers 6 are provided on the second surface 2b of the semiconductor substrate 2. The second surface 2b of the semiconductor substrate 2 is covered with a protective layer 8 except the external connection terminals 7. The penetrating wiring layers 6 existing on the second surface 2b are covered with the protective layer 8.

A light-transmissive protective member 9 is disposed on the semiconductor substrate 2 so as to cover the first surface 2a. The light-transmissive protective member 9 is adhered to the first surface 2a of the semiconductor substrate 2 via an adhesive layer 10 disposed at an outer peripheral portion of the first surface 2a of the semiconductor substrate 2. A gap 11 is formed between the light-transmissive protective member 9 and the first surface 2a of the semiconductor substrate 2 based on a thickness of the adhesive layer 10. Namely, the light-transmissive protective member 9 is disposed above the light-receiving portion 3 provided at the first surface 2a of the semiconductor substrate 2 via the gap 11.

A protective film 12 is formed on a front surface of the light-transmissive protective member 9, namely on a first surface 9a at an opposite side of a second surface 9b facing the first surface 2a of the semiconductor substrate 2. The protective film 12 has an opening 12a provided above the light-receiving portion 3. The protective film 12 has the opening 12a so as not to prevent the incidence of the energy lines such as the light and the electrons on the light-receiving portion 3. The protective film 12 is provided only at a peripheral edge portion of the front surface 9a of the light-transmissive protective member 9 except the opening 12a. In the protective film 12, at least the portion positioning above the light-receiving portion 3 is opened. A size of the opening 12a is set while considering an incident angle and so on of the energy line light-received at the light-receiving portion 3, and it may be larger than the light-receiving portion 3.

Figure 2:
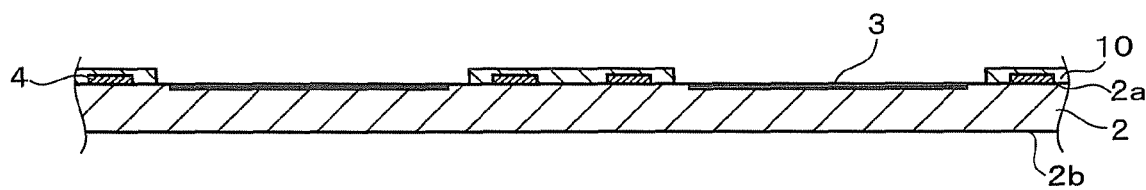
FIG. 2 is a view showing a preparatory stage of a semiconductor substrate in a manufacturing process of the semiconductor device.

The semiconductor device 1 of the first embodiment is manufactured, for example, as follows. At first, the semiconductor substrate 2 in which the light-receiving portions 3 and the electrodes 4 are provided at the first surface 2a is prepared, as shown in FIG. 2. The semiconductor substrate 2 is supplied as a semiconductor wafer, and the light-receiving portion 3 and the electrodes 4 are provided inside the active element region of each device constitution region of the semiconductor wafer. The electrodes 4 are electrically connected to the light-receiving portion 3 and the other elements within the active element region, the wirings, and so on. Further, the adhesive layer 10 is formed at an outer peripheral region except the light-receiving portions 3 of the first surface 2a of the semiconductor substrate 2. An adhesive agent composed of an epoxy resin, a polyimide resin, an acrylic resin, or the like is used for the adhesive layer 10.

Figure 3:
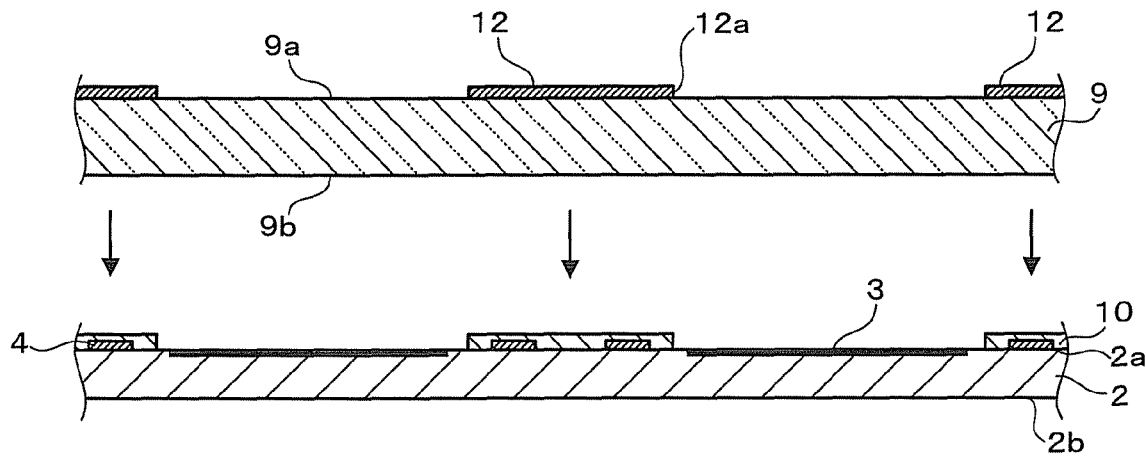
FIG. 3 is a view showing a preparatory stage of a light-transmissive protective member in the manufacturing process of the semiconductor device.
Figure 4:
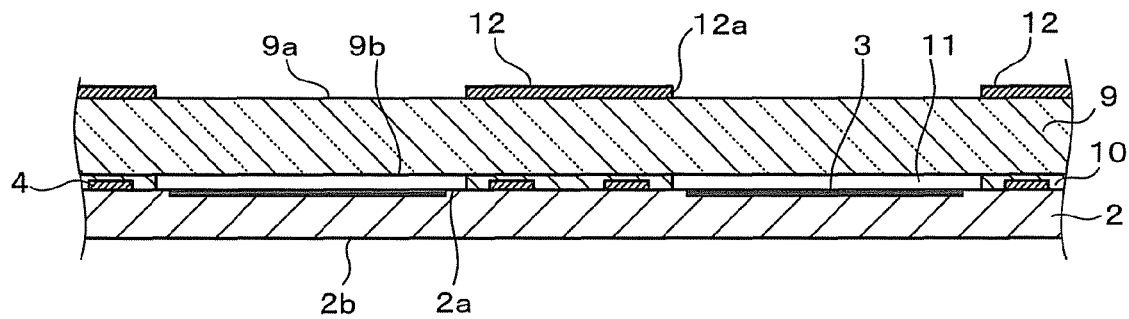
FIG. 4 is a view showing an adhering stage of the semiconductor substrate and the light-transmissive protective member in the manufacturing process of the semiconductor device.

Next, the light-transmissive protective member 9 having approximately the same size with the semiconductor substrate (semiconductor wafer) 2 is prepared as shown in FIG. 3. A glass substrate composed of, for example, a borosilicate glass, a quartz glass, or a soda-lime glass is used as the light-transmissive protective member 9. The light-transmissive protective member 9 may be constituted by a semiconductor substrate such as silicon (Si), gallium arsenide (GaAs), when the light to be transmitted is infrared light. The protective film 12 is formed at the front surface 9a of the light-transmissive protective member 9. The openings 12a are provided at the regions of the protective film 12 corresponding to the light-receiving portions 3.

The protective film 12 is formed by a sputtering method, a CVD method, a vapor deposition method, a plating method, a spin coating method, a spray coating method, a printing method, and so on. For example, metal materials such as high-resistance metal materials (Ti, TiN, TiW, Ni, Cr, TaN, COWP, and so on), low-resistance metal materials (Al, Al—Cu, Al—Si—Cu, Cu, Au, Ag, and so on), a semiconductor material such as polycrystalline silicon, and conductive organic materials such as resin materials including a conductive high molecular compound and conductive particles (for example, the epoxy resin and the polyimide resin) are used as a composing material of the protective film 12. The protective film 12 may be formed by an insulating resin material and so on, but it is preferable to be formed by the conductive material with considering an electrostatic chuck property during a wafer process.

Further, it is preferable that the protective film 12 has a light-blocking property. It is desirable that a coloring material (black material) such as carbon black is to be added to the resin material to make it black so as to add the light-blocking property to the protective film 12 when the protective film 12 is formed by the resin material. The high-resistance metal material and the low-resistance metal material are preferable as the composing material of the protective film 12 because they have both the conductivity and the light-blocking property. The protective film 12 may be constituted by a single layer film of various metal materials, or may be constituted by a multilayer film in which plural metal material layers are laminated. A semiconductor material such as polycrystalline silicon is used as the protective film 12 having the light-blocking property, because the semiconductor material has the light-blocking property to a visible light region. The protective film 12 is preferable to be formed with the conductive organic material containing the coloring material.

The protective film 12 is provided at the peripheral region except the regions corresponding to the light-receiving portions 3 (light-transmitting regions) of the semiconductor substrate 2 on the front surface 9a of the light-transmissive protective member 9. The front surface 9a of the light-transmitting region of the light-transmissive protective member 9 is in a concave state relative to the protective film 12. Namely, the protective film 12 is formed to be a convex state relative to the front surface 9a of the light-transmissive protective member 9, and the light-transmitting region of the light-transmissive protective member 9 is in the concave state based on a thickness of the protective film 12. Accordingly, it is prevented that the light-transmitting region (the front surface 9a) of the light-transmissive protective member 9 is directly touched during the wafer process.

It is preferable that the protective film 12 has the thickness within a range of 1 μm to 50 μm. When the thickness of the protective film 12 is less than 1 μm, a level difference between the light-transmissive region of the light-transmissive protective member 9 and the protective film 12 becomes insufficient. Accordingly, there is a possibility that a function of the light-transmissive protective member 9 to protect the light-transmitting region (the front surface 9a) goes short during the wafer process. When the thickness of the protective film 12 is made too thick, there is a possibility in which the energy lines such as the light and electrons are prevented to incident on the light-receiving portion 3. Accordingly, the thickness of the protective film 12 is preferable to be 50 μm or less.

The light-transmissive protective member 9 as stated above is disposed on the semiconductor substrate 2 so that the second surface 9b at the opposite side of the first surface 9a having the protective film 12 faces the first surface 2a of the semiconductor substrate 2. As shown in FIG. 3, the second surface 9b of the light-transmissive protective member 9 and the first surface 2a of the semiconductor substrate 2 are adhered via the adhesive layer 10. The light-transmissive protective member 9 and the semiconductor substrate 2 are adhered via the adhesive layer 10 by, for example, being pressurized and heated. The gap 11 is formed between the light-transmissive protective member 9 and the semiconductor substrate 2 based on a forming position and a thickness of the adhesive layer 10. The light-receiving portion 3 of the semiconductor substrate 2 is disposed so as to expose to the gap 11.

Figure 5:
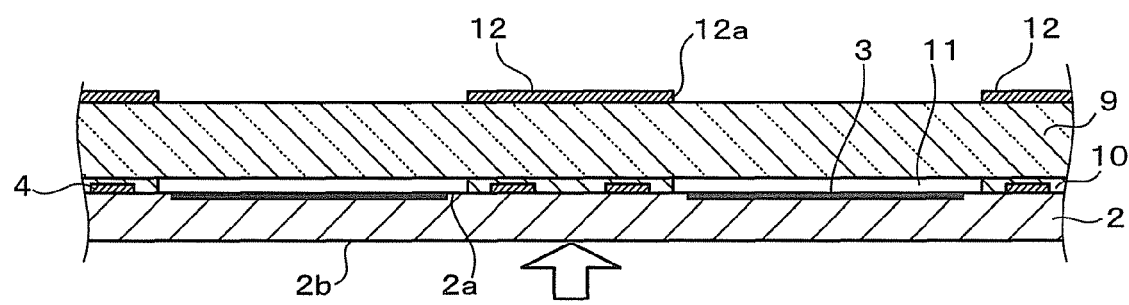
FIG. 5 is a view showing a process stage of the semiconductor substrate in the manufacturing process of the semiconductor device.

Next, the second surface 2b of the semiconductor substrate 2 is processed by, a mechanical grinding, a chemical mechanical polishing (CMP), a wet etching, a dry etching, and so on, to make the semiconductor substrate 2 thin from the second surface 2b side, as shown in FIG. 5. The thickness of the semiconductor substrate 2 is preferable to be approximately from 50 μm to 150 μm. This manufacturing process is not necessary when the semiconductor substrate 2 which is made thin in advance is used. However, the light-transmissive protective member 9 plays a role as a supporting substrate mechanically reinforcing the semiconductor substrate 2, and therefore, it is preferable that the final process of the semiconductor substrate 2 is to be performed after the light-transmissive protective member 9 is adhered.

Figure 6:
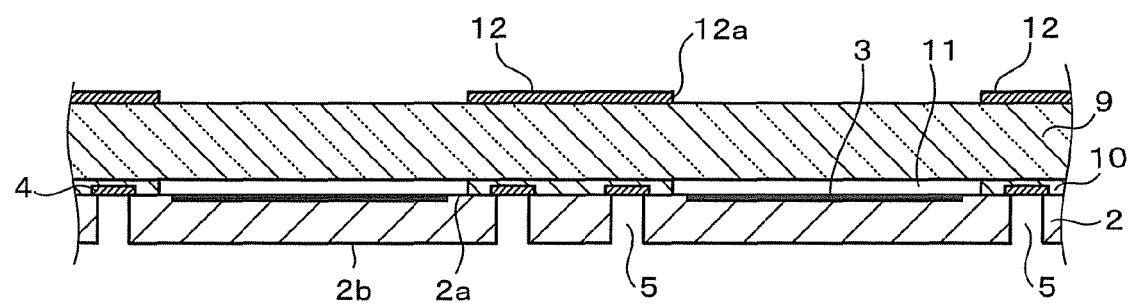
FIG. 6 is a view showing a forming stage of through holes in the manufacturing process of the semiconductor device.

Through holes 5 are formed from the second surface 2b of the semiconductor substrate 2 toward the first surface 2a, to expose the electrodes 4 inside the through holes 5, as shown in FIG. 6. The through holes 5 are formed by etching the semiconductor substrate 2 by a plasma etching method, by using a mask with a predetermined pattern disposed at the second surface 2b side of the semiconductor substrate 2. The through hole 5 may be formed by a laser etching method. In this case, the mask is not necessary. The through hole 5 has, for example, a cross-sectional shape in the convex state toward the first surface 2a in a vicinity of the electrode 4.

Figure 7:
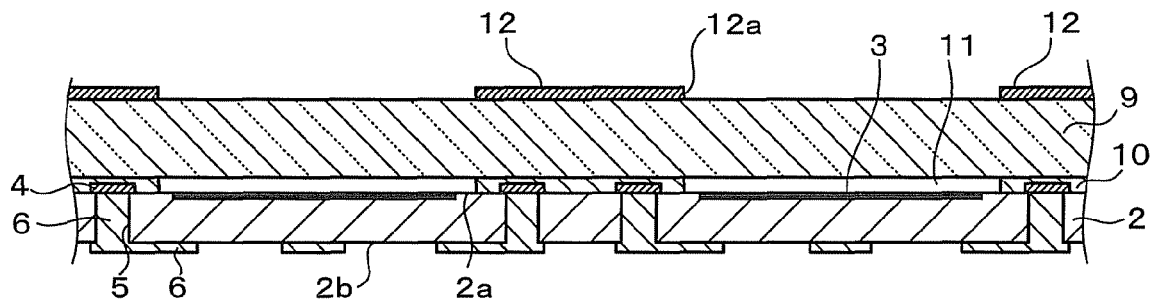
FIG. 7 is a view showing a forming stage of wiring layers in the manufacturing process of the semiconductor device.

Subsequently, the penetrating wiring layers 6 are formed from inside the through holes 5 toward the second surface 2b of the semiconductor substrate 2, as shown in FIG. 7. The insulating layers (not-shown) are formed in advance inside the through holes 5 and on the second surface 2b of the semiconductor substrate 2 so as to insulate between the penetrating wiring layers 6 and the semiconductor substrate 2. The opening is provided at the insulating layer of the through hole 5 in advance, and therefore, the penetrating wiring layer 6 is connected to the electrode 4.

The penetrating wiring layers 6 are formed by the sputtering method, the CVD method, the vapor deposition method, the plating method, the printing method, and so on by using a mask with a predetermined pattern. For example, the high-resistance metal materials (Ti, TiN, TiW, Ni, Cr, TaN, COWP, and so on) and the low-resistance metal materials (Al, Al—Cu, Al—Si—Cu, Cu, Au, Ag, solder materials, and so on), are used for the penetrating wiring layer 6. These materials constitute a wiring layer (a conductive layer) in a single-layer structure or a multilayer structure in which plural material layers are laminated.

Figure 8:
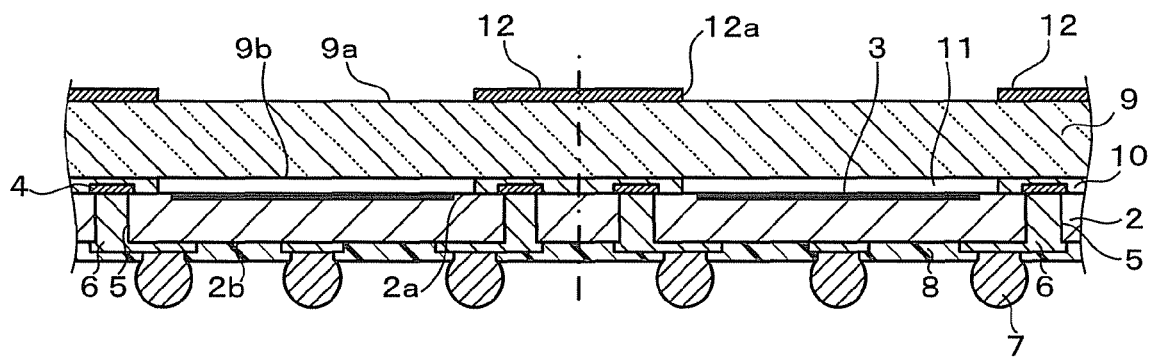
FIG. 8 is a view showing a forming stage of external connection terminals and a protective layer in the manufacturing process of the semiconductor device.

After this, the external connection terminals 7 are formed at the penetrating wiring layers 6, and the protective layer 8 is formed so as to cover the second surface 2b of the semiconductor substrate 2 except the external connection terminals 7, as shown in FIG. 8. The external connection terminals 7 are formed with, for example, the solder materials. The protective layer 8 is formed with the polyimide resin, the epoxy resin, a solder resist material, or the like. The semiconductor device 1 shown in FIG. 1 is manufactured by cutting the semiconductor substrate 2 together with the light-transmissive protective member 9 with a blade to be a separated piece, after a series of processes (the wafer process) is completed.

In the semiconductor device 1 of the first embodiment, the protective film 12 having the opening 12a at the region (the light-transmitting region) corresponding to the light-receiving portion 3 is provided on the front surface 9a of the light-transmissive protective member 9 covering the first surface 2a (including the light-receiving portion 3) of the semiconductor substrate 2. The front surface 9a of the light-transmitting region of the light-transmissive protective member 9 is in the concave state relative to the protective film 12, and therefore, there isn't the possibility in which the light-transmitting region of the light-transmissive protective member 9 (the front surface 9a) is directly touched during the processes of making the semiconductor substrate 2 thin and forming the through holes 5 at the semiconductor substrate 2. The scratches and cracks on occurred at the front surface 9a of the light-transmissive protective member 9 are suppressed, and the scattering of the incident light can be suppressed.

Further, the light incident on the light-receiving portion 3 from the diagonal direction transmitting through the light-transmissive protective member 9 is blocked by forming the protective film 12 provided at an outside of the light-receiving portion 3 with the light-blocking material. Consequently, it is possible to prevent that the light is incident on the light-receiving portion 3 from the unnecessary diagonal direction. Accordingly, it becomes possible to improve the characteristics, the manufacturing yield, and so on of the semiconductor device 1 having the light-receiving portion 3, and to enhance the characteristics such as image pickup characteristics depending on the light-receiving portion 3. Namely, it is possible to provide the semiconductor device 1 excelling in the characteristics and the manufacturing yield, with good reproducibility.

Figure 9:
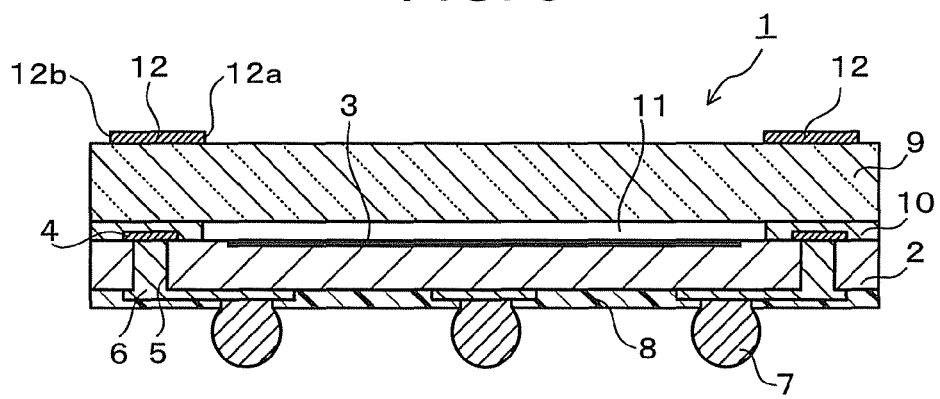
FIG. 9 is a sectional view showing a first modified example of the semiconductor device shown in FIG. 1.

FIG. 9 shows a first modified example of the semiconductor device 1 according to the first embodiment. In the semiconductor device 1 shown in FIG. 9, the protective film 12 provided at the surface (first surface) 9a of the light-transmissive protective member 9 goes back from the outer peripheral portion toward inside of the light-transmissive protective member 9 so as to expose an outer edge portion of the light-transmissive protective member 9. In otherwords, the protective film 12 has a second opening 12b exposing the outer edge portion of the light-transmissive protective member 9 in addition to the first opening 12a opening the region of the light-transmissive protective member 9 (the light-transmitting region) corresponding to the light-receiving portion 3.

As stated above, the protective film 12 is backed toward inside to expose the outer edge portion of the light-transmissive protective member 9, and thereby, loading of the blade resulting from the protective film 12 is suppressed when the semiconductor substrate 2 is cut together with the light-transmissive protective member 9. Consequently, it is prevented that large chippings, cracks, and so on occur at the outer edge portion of the light-transmissive protective member 9. Accordingly, it is possible to further improve the manufacturing yield of the semiconductor device 1.

Figure 10:
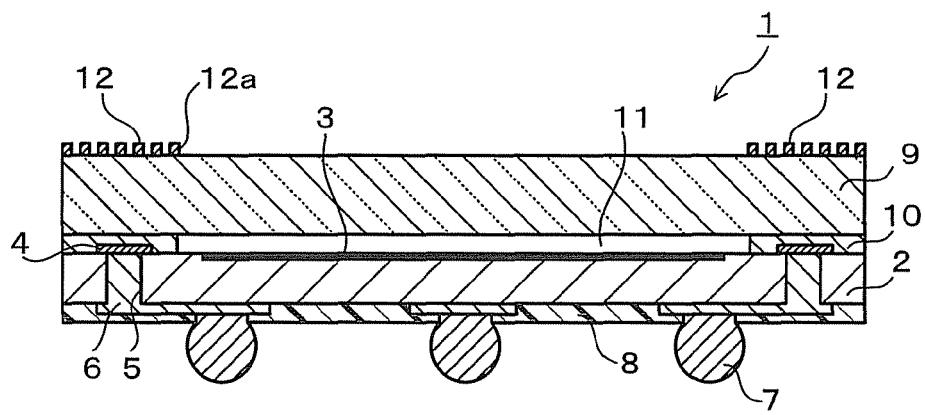
FIG. 10 is a sectional view showing a second modified example of the semiconductor device shown in FIG. 1.
Figure 11:
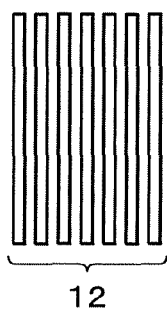
FIG. 11 is a plan view showing an example of a protective film of the light-transmissive protective member shown in FIG. 10.
Figure 12:
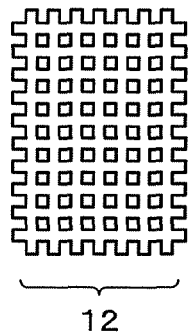
FIG. 12 is a plan view showing another example of the protective film of the light-transmissive protective member shown in FIG. 10.
Figure 13:
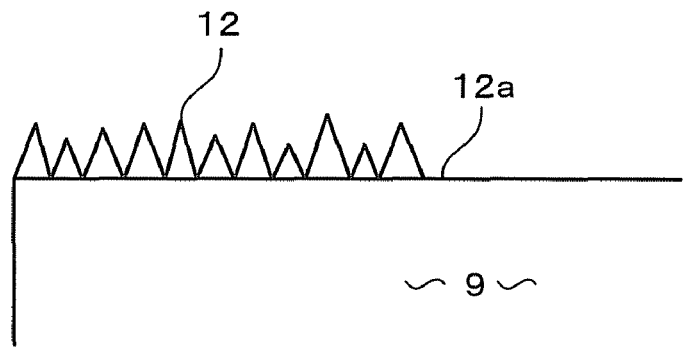
FIG. 13 is a sectional view showing still another example of the protective film of the light-transmissive protective member shown in FIG. 10.

FIG. 10 shows a second modified example of the semiconductor device 1 according to the first embodiment. In the semiconductor device 1 shown in FIG. 10, the protective film 12 has a concave and convex shape. As concrete examples of the concave and convex shape of the protective film 12, a linear state shown in a plan view in FIG. 11 and a lattice state shown in a plan view in FIG. 12 can be cited. The protective film 12 may have a needle state concave and convex cross-sectional shape as shown in FIG. 13. The concave and convex portion of the protective film 12 enhances conformability for the adhesive agent, and further shows anchoring effect when a lens module (not-shown) is mounted on the light-transmissive protective member 9. Consequently, it is possible to improve adhesiveness of the lens module and to enhance mechanical reliability.

Figure 14:
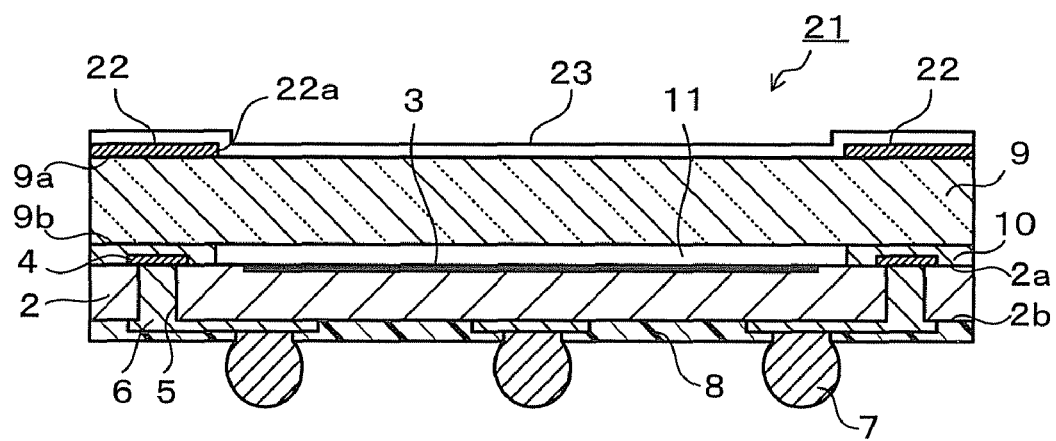
FIG. 14 is a sectional view showing a semiconductor device according to a second embodiment.

Next, a semiconductor device according to a second embodiment of the present invention is described with reference to FIG. 14. FIG. 14 shows a semiconductor device 21 according to the second embodiment. In FIG. 14, the same portions as FIG. 1 are represented by adding the same reference numerals, and the description thereof is partially not given. In the semiconductor device 21 shown in FIG. 14, a first protective film 22 having an opening 22a opening the region corresponding to the light-receiving portion 3 of the semiconductor substrate 2 is provided on the first surface 9a of the light-transmissive protective member 9. The first protective film 22 has the same composition as the above-stated protective film 12 of the first embodiment, and a shape and so on of the opening 22a are the same as the opening 12a of the protective film 12 of the first embodiment.

The first surface 9a of the light-transmissive protective member 9 including on the first protective film 22 is covered with a second protective film 23. The second protective film 23 is provided on the first protective film 22 and on the exposed front surface 9a of the light-transmissive protective member 9 based on the opening 22a. The second protective film 23 is composed of a light-transmissive nonmetallic protective film, and a film thickness thereof is thinner than that of the first protective film 22. The semiconductor device 21 of the second embodiment has the similar constitution to the semiconductor device 1 of the first embodiment other than the second protective film 23.

The second protective film 23 composed of the light-transmissive nonmetallic protective film is formed so as to along a shape of the first protective film 22 having the opening 22a, by the CVD method, the spin coating method, the spray coating method, and so on. The second protective film 23 is formed by, for example, a silicon compound such as silicon oxide ($SiO_2$) and silicon nitride ($SiN_x$), a light-transmissive resin material, or the like. It is preferable to apply the silicon oxide ($SiO_2$) from a point of view of the light transmission property from among the above-stated materials. The film thickness of the second protective film 23 is thinner than the first protective film 22. The film thickness of the second protective film 23 is preferable to be within a range of 0.1 μm to 1 μm in addition to satisfying a condition.

In the semiconductor device 21 of the second embodiment, it is possible to prevent metallic contamination from a surface of the first protective film 22 to processing equipments, in addition to the similar effects to the first embodiment (the suppression of the scratches and cracks to the front surface 9a of the light-transmissive protective member 9, the improvement in characteristics and yield of the semiconductor device 21). Namely, it is possible to prevent that the processing equipments are metal-contaminated from the surface of the first protective film 22 by covering the surface thereof with the second protective film 23 composed of the nonmetallic protective film even when the first protective film 22 is composed of a metallic film. Accordingly, it is possible to further improve the manufacturing yield of the semiconductor device 21.

A region of the front surface 9*a* of the light-transmissive protective member 9 (an exposed portion by the opening 22*a*) corresponding to the light-receiving portion 3 is in a concave state relative to the first protective film 22, because the film thickness of the second protective film 23 is thinner than the first protective film 22. Accordingly, the scratches and so on do not occur during the wafer process. Further, the electrostatic chuck can be applied by fully making the thickness of the second protective film 23 thin, even when the second protective film 23 is composed of the insulating materials such as the silicon oxide ($SiO_2$), the resin material, and so on. It is thereby possible to provide the semiconductor device 21 excelling in manufacturing efficiency and characteristics.

It should be noted that the present invention is not limited to the above-described embodiments as they are, and it can be embodied to various semiconductor devices in which between a front surface and a rear surface of a semiconductor substrate are connected by a penetrating wiring layer, and a light-transmissive protective member is disposed on the semiconductor substrate. The semiconductor device as stated above is included in the present invention. Besides, the embodiments of the present invention can be expanded/modified within the range of the technical scope of the present invention, and such expanded/modified embodiments are also included in the technical scope of the present invention.

What is claimed is:

1. A semiconductor device, comprising:
   a semiconductor substrate having a first surface and a second surface at an opposite side of the first surface;
   a light-receiving portion provided on the first surface of the semiconductor substrate;
   an electrode, provided on the first surface of the semiconductor substrate, electrically connecting to the light-receiving portion;
   a penetrating wiring layer, provided at the semiconductor substrate to join the first surface and the second surface, electrically connecting to the electrode;
   a light-transmissive protective substrate disposed immediately above the light-receiving portion via only a gap, to cover the first surface of the semiconductor substrate;
   a protective film, formed on a first surface of the light-transmissive protective substrate at an opposite side of a second surface of the light-transmissive protective substrate facing the first surface of the semiconductor substrate in contact with the first surface of the light-transmissive protective substrate, having an opening corresponding to the light-receiving portion; and
   a light-transmissive nonmetallic protective film provided to cover the first surface of the light-transmissive protective substrate including on the protective film, the light-transmissive nonmetallic protective film having a thickness thinner than that of the protective film,
   wherein the protective film has conductivity.

2. The semiconductor device according to claim 1,
   wherein the protective film is composed of at least one selected from a metallic material, a semiconductor material, and a conductive organic material.

3. The semiconductor device according to claim 2,
   wherein the metallic material comprises a high-resistance metal material including at least one selected from Ti, TiN, TiW, Ni, Cr, TaN and CoWP.

4. The semiconductor device according to claim 2,
   wherein the metallic material comprises a low-resistance metal material including at least one selected from Al, Cu, Au, Ag, Al—Cu alloy and Al—Si—Cu alloy.

5. The semiconductor device according to claim 2,
   wherein the semiconductor material comprises a polycrystalline silicon.

6. The semiconductor device according to claim 1,
   wherein the protective film has a light-blocking property, and is composed of at least one selected from a metallic material, a semiconductor material, and a conductive organic material containing a coloring material.

7. The semiconductor device according to claim 1,
   wherein the protective film has a thickness within a range of 1 μm to 50 μm.

8. The semiconductor device according to claim 1,
   wherein the protective film goes back from an outer peripheral portion of the light-transmissive protective substrate toward inside.

9. The semiconductor device according to claim 1,
   wherein the protective film has a concave and convex shape.

10. The semiconductor device according to claim 1,
    wherein the light-transmissive nonmetallic protective film is composed of silicon oxide or silicon nitride.

11. A manufacturing method of a semiconductor device, comprising:
    preparing a semiconductor substrate having a first surface including a light-receiving portion and an electrode electrically connected to the light-receiving portion, and a second surface at an opposite side of the first surface;
    preparing a light-transmissive protective substrate having a first surface including a protective film having an opening corresponding to the light-receiving portion, and a second surface at an opposite side of the first surface, the protective film being formed on the first surface of the light-transmissive protective substrate in contact with the first surface of the light-transmissive protective substrate;
    adhering the first surface of the semiconductor substrate and the second surface of the light-transmissive protective substrate by an adhesive layer provided at an outer peripheral portion of the first surface of the semiconductor substrate while forming only a gap above the light-receiving portion;
    forming a through hole at the semiconductor substrate from the second surface toward the first surface of the semiconductor substrate to expose the electrode;
    forming a penetrating wiring layer connected to the electrode exposing inside the through hole, from inside the through hole toward the second surface of the semiconductor substrate; and
    forming a light-transmissive nonmetallic protective film to cover the first surface of the light-transmissive protective substrate including on the protective film, the light-transmissive non-metallic protective film having a thickness thinner than that of the protective film,
    wherein the protective film is formed with a conductive material.

12. The manufacturing method of the semiconductor device according to claim 11,
    wherein the protective film is formed with at least one selected from a metallic material, a semiconductor material, and a conductive organic material.

13. The manufacturing method according to claim 12, wherein the metallic material comprises a high-resistance metal material including at least one selected from Ti, TiN, TiW, Ni, Cr, TaN and CoWP.

14. The manufacturing method according to claim 12, wherein the metallic material comprises a low-resistance metal material including at least one selected from Al, Cu, Au, Ag, Al—Cu alloy and Al—Si—Cu alloy.

15. The manufacturing method according to claim 12, wherein the semiconductor material comprises a polycrystalline silicon.

16. The manufacturing method according to claim 11, wherein the light-transmissive nonmetallic protective film is composed of silicon oxide or silicon nitride.

17. A manufacturing method of a semiconductor device, comprising:

preparing a semiconductor substrate having a first surface including a light-receiving portion and an electrode electrically connected to the light-receiving portion, and a second surface at an opposite side of the first surface;

preparing a light-transmissive protective substrate having a first surface including a protective film having an opening corresponding to the light-receiving portion, and a second surface at an opposite side of the first surface, the protective film being formed on the first surface of the light-transmissive protective substrate in contact with the first surface of the light-transmissive protective substrate;

adhering the first surface of the semiconductor substrate and the second surface of the light-transmissive protective substrate by an adhesive layer provided at an outer peripheral portion of the first surface of the semiconductor substrate while forming only a gap above the light-receiving portion;

forming a through hole at the semiconductor substrate from the second surface toward the first surface of the semiconductor substrate to expose the electrode; and forming a penetrating wiring layer connected to the electrode exposing inside the through hole, from inside the through hole toward the second surface of the semiconductor substrate, wherein the protective film is formed with a conductive material and has a thickness within a range from 1 μm to 50 μm.

* * * * *